United States Patent
Jung et al.

(10) Patent No.: US 9,940,987 B2
(45) Date of Patent: Apr. 10, 2018

(54) HIGH-SPEED WORD LINE DECODER AND LEVEL-SHIFTER

(71) Applicant: QUALCOMM Incorporated, San Diego, CA (US)

(72) Inventors: Chulmin Jung, San Diego, CA (US); Po-Hung Chen, San Diego, CA (US); David Li, San Diego, CA (US); Sei Seung Yoon, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 135 days.

(21) Appl. No.: 15/070,963

(22) Filed: Mar. 15, 2016

(65) Prior Publication Data
US 2016/0276005 A1 Sep. 22, 2016

Related U.S. Application Data

(60) Provisional application No. 62/133,840, filed on Mar. 16, 2015.

(51) Int. Cl.
| | | |
|---|---|---|
| *G11C 7/00* | (2006.01) | |
| *G11C 8/08* | (2006.01) | |
| *G11C 8/10* | (2006.01) | |
| *G11C 8/06* | (2006.01) | |
| *G11C 5/14* | (2006.01) | |

(52) U.S. Cl.
CPC .............. *G11C 8/08* (2013.01); *G11C 8/06* (2013.01); *G11C 8/10* (2013.01); *G11C 5/14* (2013.01)

(58) Field of Classification Search
CPC .... G11C 8/08; G11C 8/06; G11C 8/10; G11C 5/14
See application file for complete search history.

(56) References Cited

U.S. PATENT DOCUMENTS

| | | |
|---|---|---|
| 6,031,781 A | 2/2000 | Tsuji et al. |
| 7,463,545 B2 | 12/2008 | Kumala |
| 7,738,313 B2 | 6/2010 | Futatsuyama |
| 8,391,097 B2 | 3/2013 | Chan et al. |
| 8,456,946 B2 | 6/2013 | Ghosh et al. |
| 8,842,464 B2 | 9/2014 | Jung et al. |

(Continued)

FOREIGN PATENT DOCUMENTS

WO WO-2013147742 A1 10/2013

OTHER PUBLICATIONS

International Search Report and Written Opinion—PCT/US2016/022593—ISA/EPO—Jun. 15, 2016.

*Primary Examiner* — Mohammed A Bashar
(74) *Attorney, Agent, or Firm* — Haynes and Boone, LLP

(57) ABSTRACT

A memory is provided that includes a row decoder that decodes an address into a plurality of decoded signals for selecting a word line to be asserted from a plurality of word lines. Each word line is driven through a decoder level-shifter that processes the decoded signals. Each decoder level-shifter corresponds to a unique combination of the decoded signals. The row decoder is in a logic power domain such that the decoded signals are asserted to a logic power supply voltage. When a decoder level-shifter's unique combination of decoded signals are asserted by the row decoder, the decoder level-shifter drives the corresponding word line with a memory power supply voltage for a memory power domain.

19 Claims, 5 Drawing Sheets

(56) References Cited

U.S. PATENT DOCUMENTS

| | | |
|---|---|---|
| 8,971,133 B1 | 3/2015 | Zheng et al. |
| 2006/0132227 A1* | 6/2006 | Kushida .................. G11C 8/10 327/544 |
| 2006/0176081 A1* | 8/2006 | Dawson ............. H03K 19/0963 326/108 |
| 2014/0159773 A1 | 6/2014 | Shin |

* cited by examiner

US 9,940,987 B2

HIGH-SPEED WORD LINE DECODER AND LEVEL-SHIFTER

CROSS REFERENCE TO RELATED APPLICATIONS

This application claims the benefit of U.S. Provisional Application No. 62/133,840, filed Mar. 16, 2015.

TECHNICAL FIELD

This application relates to memories, and more particularly to a high-speed level decoder and level-shifter for driving a word line.

BACKGROUND

As semiconductor technology has advanced into the deep submicron regime, the power supply voltage is scaled down in concert with the scaling of the transistor dimensions. For example, microprocessors are now manufactured with transistors powered by a sub-one volt power supply voltage. But these modern systems may need to interface with embedded memories that operate in a higher voltage domain. To save power, the address decoding for the word line driving in the memories occurs in a low-voltage domain. The resulting decoded word line signal must then be level shifted up into the high power supply voltage used in the memory's high voltage domain to drive the selected word line. A conventional level-shifter 100 is shown in FIG. 1 that may perform voltage level shifts between an input signal (IN) and an output signal (OUT) for a word line drive signal.

The input signal drives a gate of an NMOS transistor MN1. If the input signal is low (ground or VSS), transistor MN1 switches off, allowing a node N1 to float with respect to ground. The input signal also drives an inverter INV that produces an inverted input signal that in turn drives a gate of an NMOS transistor MN2. Inverter INV is powered by a power supply node providing the low-voltage-domain power supply voltage VDDL. Thus, inverter INV will charge the gate of transistor MN2 to VDDL when the input signal is low, which switches on transistor MN2 to pull node N2 to ground.

Node N2 couples to a gate of a PMOS transistor MP1 that has its drain coupled to node N1. Transistor MP1 is cross-coupled with a PMOS transistor MP2. The input signal also drives a gate of a PMOS transistor MP3 in series with transistor MP1. When the input signal is low, both transistors MP3 and MP1 will be on, which charges node N1 to a high-voltage-domain power supply voltage VDDH. Node N1 drives the gate of transistor MP2 coupled to node N2. Transistor MP2 will thus be off when the input signal is low. Another PMOS transistor MP4 that has its gate driven by the inverted input signal is in series with transistor MP3.

In response to the input signal switching high to VDDL, transistor MN1 will switch on and transistor MN2 will switch off. Output node N2, which had been discharged while the input signal was low, must then float until transistor MP2 can be switched on. In turn, transistor MP2 can't switch on until transistor MN1 can discharge node N1. However, transistor MP1 is still momentarily on and attempting to keep node N1 charged, which thus fights with transistor MN1 discharging node N1. Transistor MP3 is only weakly on because VDDL is effectively a weak zero with regard to VDDH. Transistor MP3 thus assists transistor MN1 in terms of discharging node N1 by restricting the flow of charge to transistor MP1. Once node N1 is discharged, transistor MP2 will switch on. Since transistor MP4 will already be on due to the inverted input signal being driven low, the switching on of transistor MP2 will charge the output signal to VDDH. An analogous struggle occurs between transistors MN2 and MP2 when the inverted signal is driven to VDDL in response to the input signal transitioning low.

This fight between the NMOS and PMOS transistors in level-shifter 100 adversely affects memory timing due to the delay incurred during the NMOS/PMOS struggle. At higher operating speeds, such conventional level shifting for the word line introduces too much delay. Accordingly, there is a need in the improved memory designs having improved level shifting speeds for the word line drive signal as it transitions from the low-voltage domain to the high-voltage domain.

SUMMARY

A memory is provided that includes a plurality of word lines selected according to an address decoded by a row decoder. The row decoder decodes the address into a plurality of decoded signals. Each decoded signal corresponds to a decoding of a corresponding group of bits within the address. Each word line is assigned a unique combination or set of the decoded signals. The decoding of the address by the row decoder will assert only one of the sets, depending upon which word line is to be selected by the address. Thus, when a word line's set of decoded signals is asserted, none of the remaining sets of decoded signals will be asserted. Each word line is driven by a corresponding decoder level-shifter that functions to determine whether its set of decoded signals is asserted. If the set is asserted, the decoder level-shifter drives the corresponding word line to a memory power supply voltage for a memory power domain. In contrast, the row decoder is within a logic power domain that is powered by a logic power supply voltage. The decoded signals are thus asserted to the logic power supply voltage as opposed to being asserted to the memory power supply voltage.

To eliminate the delay and power loss in conventional level-shifting with regard to the driving of the word lines, each decoder level-shifter includes a first logic gate such as a NAND gate that discharges a word line driver node responsive to the decoder level-shifter's set of decoded signals all being asserted to the logic power supply voltage. A memory-power-domain inverter inverts the word line driver node voltage to drive the corresponding word line to the memory power supply voltage responsive to the discharge of the word line driver node. The first logic gate couples through a switch to a memory power supply node supplying the memory power supply voltage. A second logic gate such as a NOR gate processes a reset signal and the word line driver node voltage to control the switch. The reset signal may comprise the complement of one of the decoded signals in the set for the decoder level-shifter. The reset signal is thus discharged when all the decoded signals in the set are asserted. In response to the discharge of the word line driver node voltage and the reset signal, the second logic gate shuts off the switch. Conversely, the second logic gate drives the switch on in response to the reset signal being asserted and the set of decoded signals being de-asserted to ground. The combination of the first and second logic gate results in considerably improved memory operating speed and reduced power consumption. For example, there is no PMOS/NMOS struggle when a decoder level-shifter asserts its word line. In contrast, a conventional level-shifter for a word line will incur such a PMOS/NMOS struggle as it asserts its word line.

These and additional advantageous features may be better appreciated with regard to the following detailed description of example embodiments.

BRIEF DESCRIPTION OF THE DRAWINGS

Embodiments of the present disclosure and their advantages are best understood by referring to the detailed description that follows. It should be appreciated that like reference numerals are used to identify like elements illustrated in one or more of the figures.

DETAILED DESCRIPTION

Figure 2A:
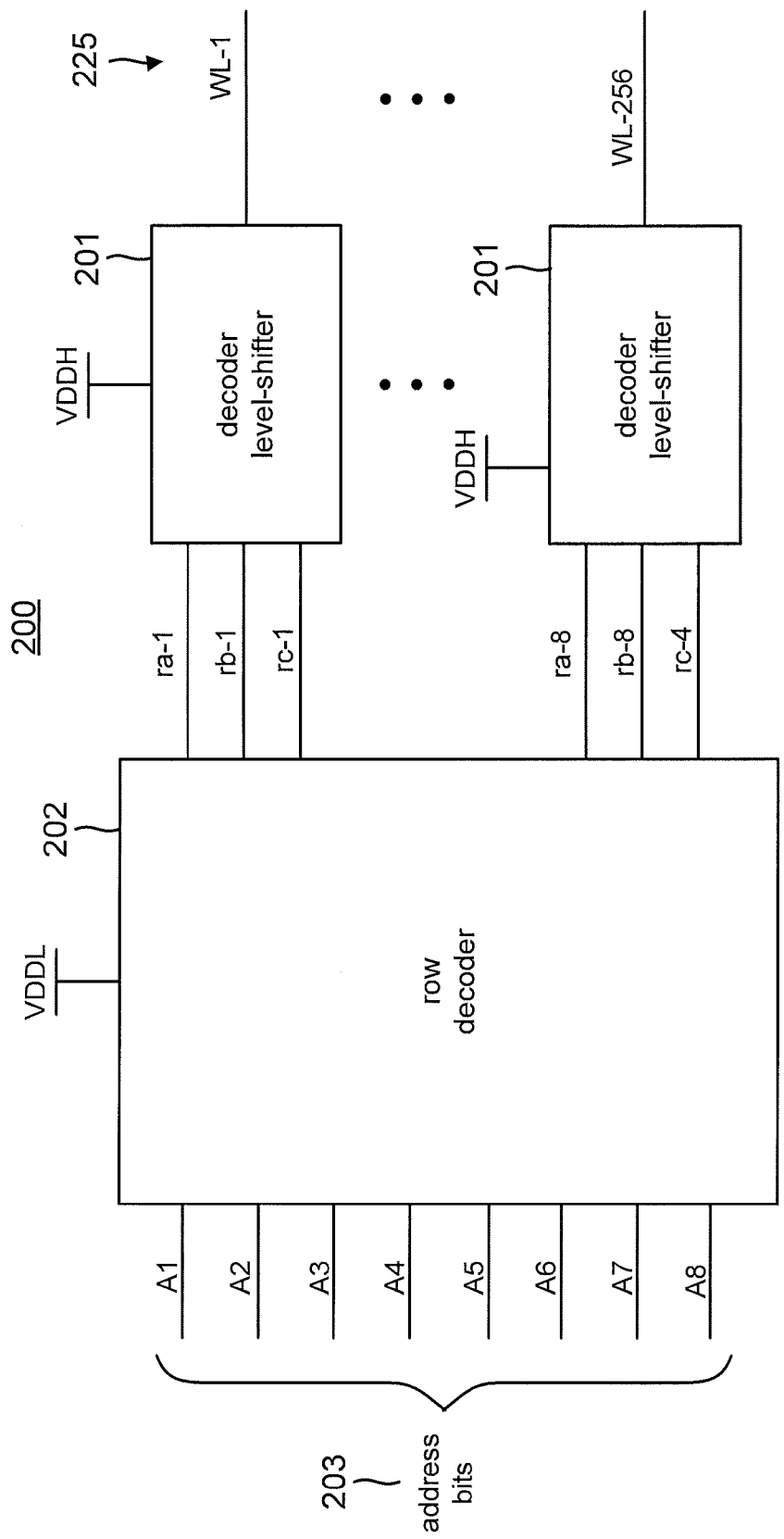
FIG. 2A is a block diagram of a memory in accordance with an aspect of the disclosure.

A word line decoder that also functions as a level-shifter is provided to increase memory operating speed. An example memory 200 is shown in FIG. 2A that includes a plurality of word lines (WL). In memory 200, there are two hundred and fifty six word lines ranging from a first word line (WL-1) to a final word line (WL-256). It will be appreciated, however, that the number of word lines may be greater than or less than 256 in alternative implementations. An 8-bit address 203 is thus sufficient to select for any one of the 256 word lines. Address 203 ranges from a first address bit A1 through a last address bit A8. A logic-power-domain row decoder 202 decodes address 203. The logic power domain is powered by a logic power supply voltage VDDL. Row decoder 202 is thus coupled to a logic domain power supply node supplying the logic power supply voltage VDDL. In contrast to row decoder 202, a plurality of decoder level-shifters 201 are within a memory power domain powered by a memory power supply voltage VDDH that is distinct from the logic power supply voltage VDDL. In general, the relative levels for the logic power supply voltage VDDL and the memory power supply voltage VDDH will depend upon the mode of operation for the integrated circuit including memory 200.

Should the logic power domain be in a high-power mode whereas the memory power domain is in a low power mode of operation, the logic power supply voltage VDDL may be higher than the memory power supply voltage. Conversely, should the logic power domain be in a standby or low power mode of operation, the memory power supply voltage VDDH may be higher than the logic power supply voltage VDDL. In general, the logic power supply voltage VDDL is typically lower than the memory power supply voltage VDDH so the following discussion will assume that the memory power supply voltage VDDH is indeed greater than logic power supply voltage VDDL. However, it will be appreciated that the level-shifting disclosed herein is also applicable to level shifting down in amplitude with regard to driving the word lines.

For the decoding of a relatively wide address such as address 203, it is quite inefficient to decode the entire address into a single decoded signal that individually corresponds to each word line. In other words, it is conceivable that row decoder 202 could decode address bits 203 into two hundred and fifty six different decoded signals such that the decoded signals correspond on a one-to-one basis with the word lines. But such a wide decoding would be slow and inefficient. Thus, row decoder 202 is configured to decode subsets of the address bits into a plurality of corresponding decoded signals. In memory 200, decoder 202 is configured to decode three address bits (for example, address bits A1, A2, and A3) into an ra decoded signal that ranges from ra-1 to ra-8. Similarly, decoder 202 is configured to decode another three address bits (for example, address bits A4, A5, and A6) into an rb decoded signal that ranges from rb-1 through rb-8. Finally, decoder 202 is configured to decode a remaining two address bits such as address bits A7 and A8 into an rc decoded signal that ranges from rc-1 through rc-4.

Decoder 202 may thus be deemed to comprise three different decoders running in parallel. A first 3-bit decoder (not illustrated) in decoder 202 produces the corresponding decoded signals ra-1 through ra-8 (the ra signals). A second 3-bit decoder in decoder 202 produces the corresponding decoded signals rb-1 through rb-8 (the rb signals). Finally, a two-bit decoder in decoder 202 produces the corresponding decoded signals rc-1 through rc-4 (the rc signals). With regard to the decoded signals, each word line has its own corresponding decoder level-shifter 201. There are thus two hundred and fifty-six decoder level-shifters 201 corresponding to the two hundred and fifty-six word lines. In implementations in which the bit cells are arranged in banks, one decoder level-shifter 201 may correspond to a pair of word lines such as a right word and a left word line. But within each bank, the correspondence of word lines to decoder level-shifters is one-to-one such as shown for memory 200.

Since there are 256 decoder level-shifters 201, there are 256/8=32 decoder level-shifters for each decoded ra signal. One group of 32 decoder level-shifters 201 would thus receive the decoded ra-1 signal. Another group of 32 decoder level-shifters 201 would receive the decoded ra-2 signal, and so on such that a final group of 32 decoder level-shifters 201 would receive the decoded ra-8 signal. An analogous grouping of decoder level-shifters 201 may be made with respect to the decoded rb signals. With respect to the decoded rc signals, there would be only four groups of decoder level-shifters 201 due to the fact that the rc signals result from decoding two address bits. The result is that each decoder level-shifter 201 receives its own unique set of the decoded signals ra, rb, and rc.

In the resulting distribution of the decoded ra, rb, and rc signals, note that just as there is a one-to-one correspondence between a decoder level-shifter 201 and its corresponding word line, there is also a one-to-one correspondence between any given instantiation of the decoded signals and the decoder level-shifters 201. For example, there is just one decoder level-shifter 201 that receives the set of decoded ra-1, rb-1, and rc-1 signals. At least one of the decoded signals will differ for all the remaining decoder level-shifters 201. For example, another decoder level-shifter (not illustrated) may receive the decoded signal ra-1 and rc-1 but could not receive decoded signal rb-1. Instead, this other decoder level-shifter would have to receive one of the remaining decoded signals rb-2 through rb-8. In this fashion, each decoder level-shifter 201 receives a unique combination or set of the decoded signals so that address signal 203 can uniquely identify each word line.

In contrast to memory 200, a conventional memory would replace each decoder level-shifter 201 by a logic-power-domain decoder such as an AND gate. In that regard, row decoder 202 functions to assert each decoded signal for a selected word line. For example, row decoder 202 would assert each of the decoded signals ra-1, rb-1, and rc-1 to the logic power supply voltage VDDL to select for word line WL-1. A conventional VDDL-powered AND gate would then drive its output high in response to receiving an asserted set of decoded signals. This AND gate output would then need to be level-shifted to VDDH for the memory power domain such as by level-shifter 100 discussed with regard to FIG. 1. But this conventional level-shifting is slow and consumes excessive power as discussed previously. In contrast, decoder level-shifters 201 are faster and consume less power.

Figure 2B:
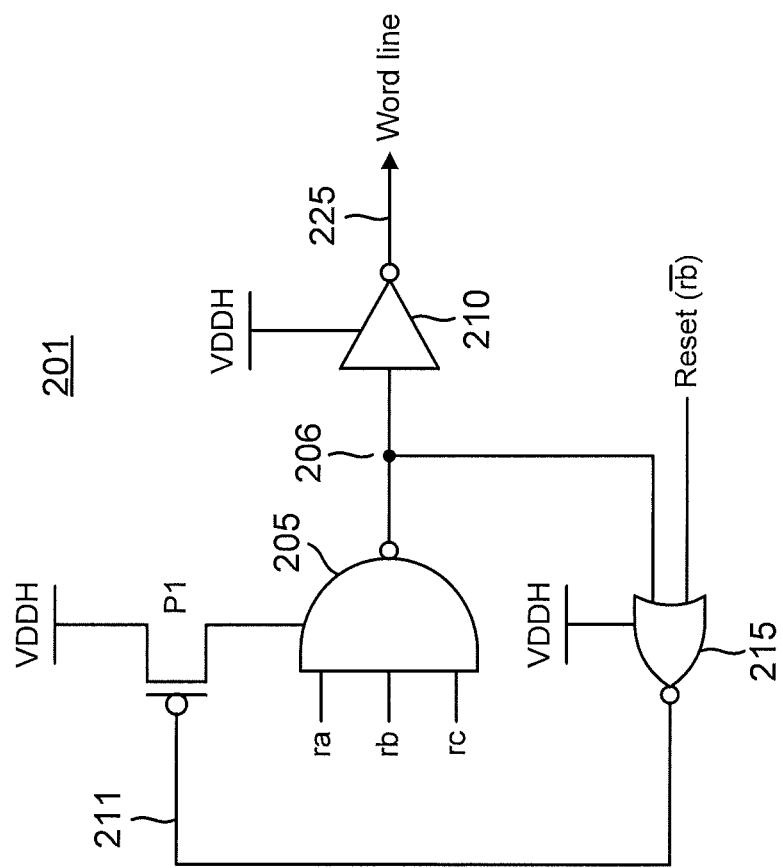
FIG. 2B is a schematic for a decoder level-shifter in the memory of FIG. 2A in accordance with an aspect of the disclosure.

To provide these advantageous features, each decoder level-shifter 201 may be implemented as shown in FIG. 2B. A first logic gate such as a NAND gate 205 processes the decoded set of ra, rb, and rc signals assigned to the particular decoder level-shifter 201. The collection of decoded signals ra, rb, and rc represent one of the 256 different instantiations of these decoded signals. Note that with regard to any individual decoded signal such as ra, rb, or rc, the decoding is finished. For example, row decoder 202 in memory 200 (FIG. 2A) decodes three address bits to assert one of the decoded signals ra-1 through ra-8. There is no further decoding to be done with regard to the assertion of the appropriate decoded signal ra. But each decoder level-shifter 201 functions to determine whether each decoded signal ra, rb, and rc in its set is asserted. So this processing stage is on the group of decoded signals ra, rb, and rc. Row decoder 202 may thus be considered to perform individual decoding whereas each decoder level-shifter 201 performs a group decoding or processing.

With regard to this group decoding, NAND gate 205 will discharge a NAND output signal carried on a NAND output node 206 (the word line driver node) if each decoded signal ra, rb, and rc in its set is asserted (charged to the logic power supply voltage VDDL by row decoder 202). A memory-power-domain inverter 210 inverts the NAND output signal to charge a word line 225 high to the memory power supply voltage VDDH when the set of decoded signals ra, rb, and rc are all asserted. NAND gate 205 couples to a memory domain power supply node supplying the memory power supply voltage VDDH through a switch such as a PMOS transistor P1. The source of transistor P1 couples to the memory domain power supply node whereas its drain couples to a power supply input node for NAND gate 205. A second logic gate such as a NOR gate 215 controls whether transistor P1 is conducting or non-conducting responsive to processing the NAND output signal and a reset signal. It is convenient to form the reset signal as a complement of one of the decoded signals such as the complement of rb ($\overline{rb}$). In that regard, note that row decoder 202 resets the decoded signals after a word line assertion period. In particular, row decoder 202 decodes address 203 and asserts the appropriate decoded signals for a word line assertion period during a read or write operation. After the word line assertion period is ended, row decoder 202 then resets all the decoded signals back to their default zero (discharged value) so that the word line is de-asserted (discharged to ground). It thus doesn't matter which of the decoded signals is selected as the reset signal since all the decoded signals ra, rb, and rc in a word line's set will be reset to zero after a word line assertion.

NOR gate 215 processes the reset signal and the NAND output signal to produce a feedback signal at a NOR output node 211 that drives the gate of transistor P1. When each of the decoded signals ra, rb, and rc in the set is asserted, the reset signal will be low along with the NAND output signal. NOR gate 215 will then assert the feedback signal to the memory power supply voltage VDDH since NOR gate 215 is within the memory power domain. Transistor P1 is turned fully off by the assertion of the feedback signal to isolate NAND gate 205 from the memory power supply voltage VDDH.

Figure 3:
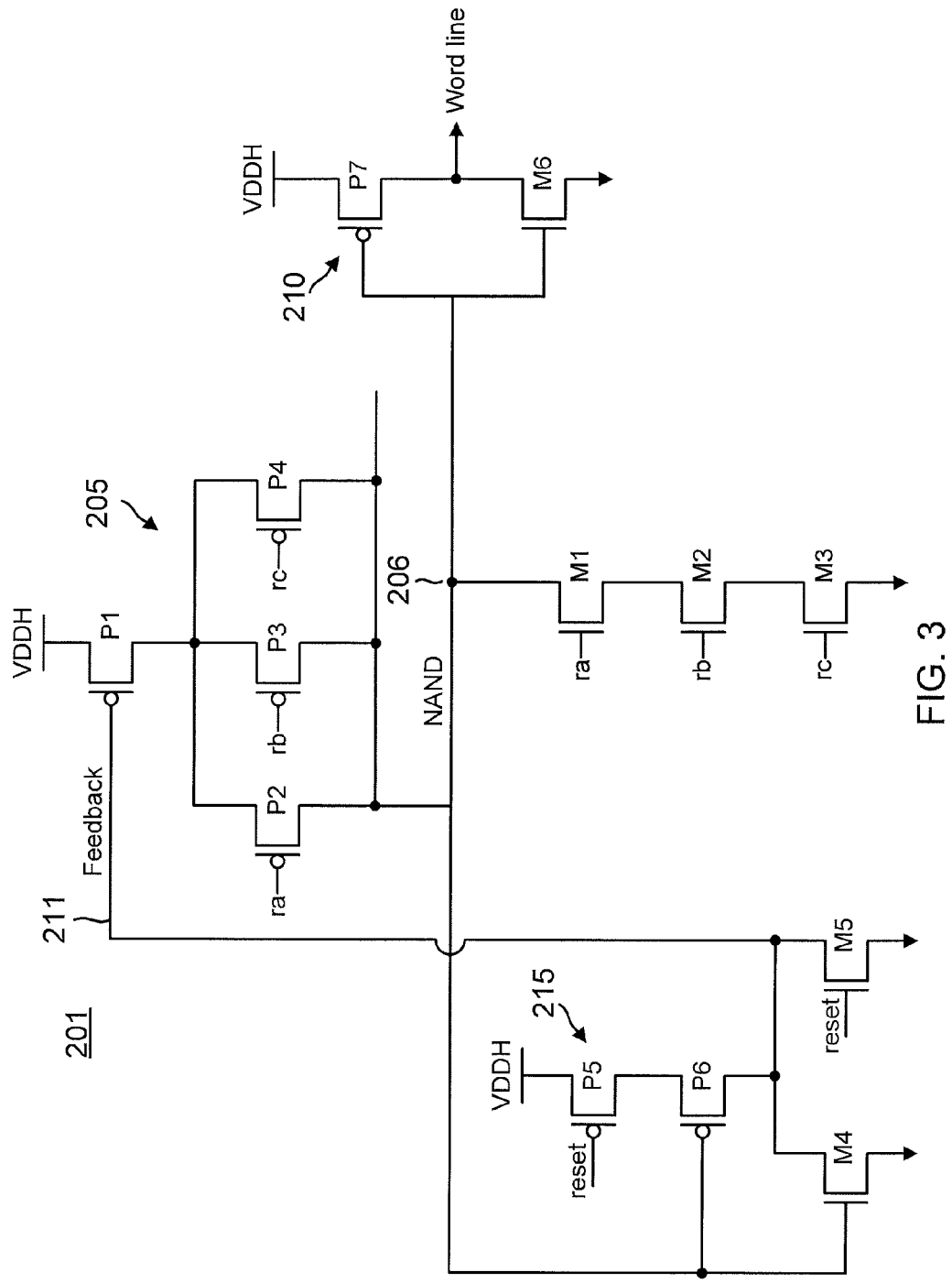
FIG. 3 is a more detailed schematic for the decoder level-shifter of FIG. 2B in accordance with an aspect of the disclosure.

NAND gate 205 may be implemented as shown in FIG. 3. NAND output node 206 couples to a drain of transistor P1 through a PMOS transistor P2 that is arranged in parallel with a PMOS transistor P3 and a PMOS transistor P4. The sources of transistors P2, P3, and P4 form a power supply input node for NAND gate 205. Decoded signal ra drives the gate of transistor P2. Similarly, decoded signal rb drives the gate of transistor P3 whereas decoded signal rc drives the gate of transistor P4. NAND output node 206 couples through a serial array of n NMOS transistors M1, an NMOS transistor M2, and an NMO transistor M3 to ground. Decoded signal ra drives the gate of transistor M1. Similarly, decoded signal rb drives the gate of transistor M2 whereas decoded signal rc drives the gate of transistor M3. Note that decoded signals ra, rb, and rc are logic domain signals that are only asserted to the VDDL power supply voltage. Should their sources couple directly to a power supply node, memory-power-domain transistors P1, P2, P3 would all be weakly on when decoded signals ra, rb, and rc are all asserted to the logic power supply voltage VDDL. Transistors P2, P3, and P4 could then fight with transistors M1, M2, and M3 during the discharge of NAND output node 206, which wastes power and slows operating speed. Isolating transistors P2, P3, and P4 from the memory power supply voltage VDDH during the discharge of NAND output node 206 by the switching off of transistor P1 is thus quite advantageous with regard to saving power and increasing memory operating speed.

Figure 1:
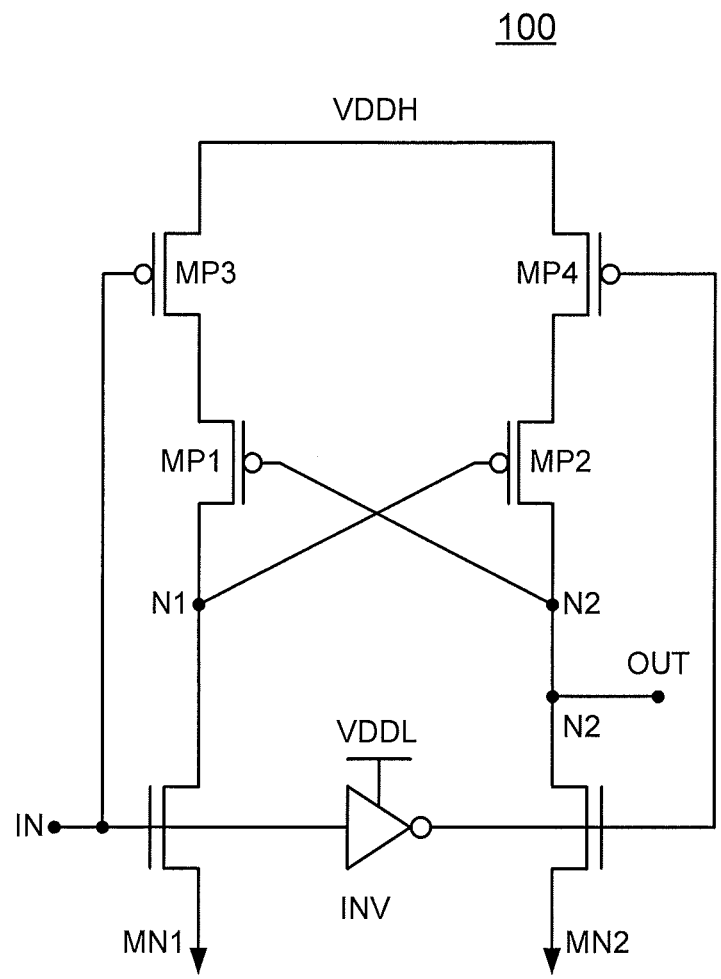
FIG. 1 is a circuit diagram of a conventional word-line level-shifter.

In general, the number of parallel-arranged PMOS transistors such as P2, P3, and P4 in NAND gate 205 depends upon the number of decoded signals, which in turn depends indirectly upon the width of address signal 203 (FIG. 1). Similarly, the number of serially-arranged NMOS transistors such as M1, M2, and M3 also depends on the number of decoded signals and thus the width of address signal 203, which in turn depends on the number of word lines within memory 200. In an embodiment having N decoded signals (N being a plural integer), NAND gate 205 may then include N PMOS transistors arranged in parallel between NAND output node 206 and the drain of transistor P1. The N PMOS transistors correspond on a one-to-one basis with decoded signals in the set of decoded signals for decoder level-shifter 201. Each decoded signal drives the gate of its corresponding PMOS transistor. Similarly, the same embodiment would include N NMOS transistors arranged in series between NAND output node 206 and ground. The N NMOS transistors would correspond on a one-to-one basis with the decoded signals such that each decoded signal in the set drives the gate of the corresponding NMOS transistor.

NOR gate 215 is arranged with regard to NOR output node 211 in a complementary fashion as compared to how NAND gate 205 is arranged with regard to NAND output node 206. In particular, a PMOS transistor P5 and a PMOS transistor P6 are arranged in series between a memory power supply node supplying the memory power supply voltage VDDH and NOR output node 211. Conversely, a NMOS transistor M4 and an NMOS transistor M5 are arranged in parallel between ground and NOR output node 211. The NAND output signal drives the gates of transistors P6 and M4. Similarly, the reset signal drives the gates of transistors P5 and M5. When the decoded signals ra, rb, and rc are asserted, the reset signal is discharged to ground to shut off transistor M5 and switch on transistor P5. Transistors M1, M2, and M3 will all conduct so that the NAND output signal is discharged, which switches on transistor P6 and shuts off transistor M4. With transistors P5 and P6 conducting, the feedback signal carried on NOR output node 211 is charged to the memory power supply voltage VDDH. If the logic power supply voltage VDDL is sufficiently lower than the memory power supply voltage VDDH, transistors P2, P3, and P4 will be weakly on when the decoded signals are all asserted. But the charging of the feedback signal to the VDDH power supply voltage switches off transistor P1 such that transistors P2, P3, and P4 cannot struggle with transistors M1, M2, and M3 with regard to the discharging of the NAND output signal. The combination of NOR gate 215 with PMOS transistor P1 may be deemed to comprise a means for isolating NAND gate 205 from the memory power supply voltage VDDH responsive to a reset of one of the decoded signals and for coupling the NAND gate to the second power supply voltage responsive to an assertion of the one of the decoded signals.

Inverter 210 comprises a PMOS transistor P7 in series with an NMOS transistor M6. The drains for transistors P7 and M6 couple to the word line. The NAND output signal drives the gates of both transistors P7 and M6. When the NAND output signal is discharged, transistor P7 will then charge the word line to the memory power supply voltage VDDH since the source of transistor P7 is tied to a memory-domain power supply node. After the read or write operation is finished, the decoded signals are then reset (discharged to ground). The reset signal will then be asserted to switch on transistor M5, which discharges the feedback signal to switch on transistor P1. Transistor P2, P3, and P4 can then charge the NAND output signal to the memory power supply voltage VDDH. Transistor M6 is switched on in response to the assertion of the NAND output signal so as to discharge the word line accordingly.

The resulting decoder level-shifter 201 is quite advantageous as compared to the use of a conventional group decoder for each word line followed by a conventional level-shifter such as level-shifter 100. In particular, there is no NMOS/PMOS struggle in decoder level-shifter 201 so the memory operating speed is advantageously increased with regard to the use of conventional level-shifter 100. In addition, this increased operating speed comes with an increase in power savings as the elimination of the NMOS/PMOS struggle eliminates the associated discharge of crow-bar current. A method of operation for a memory including a decoder level-shifter will now be discussed.

Figure 4:
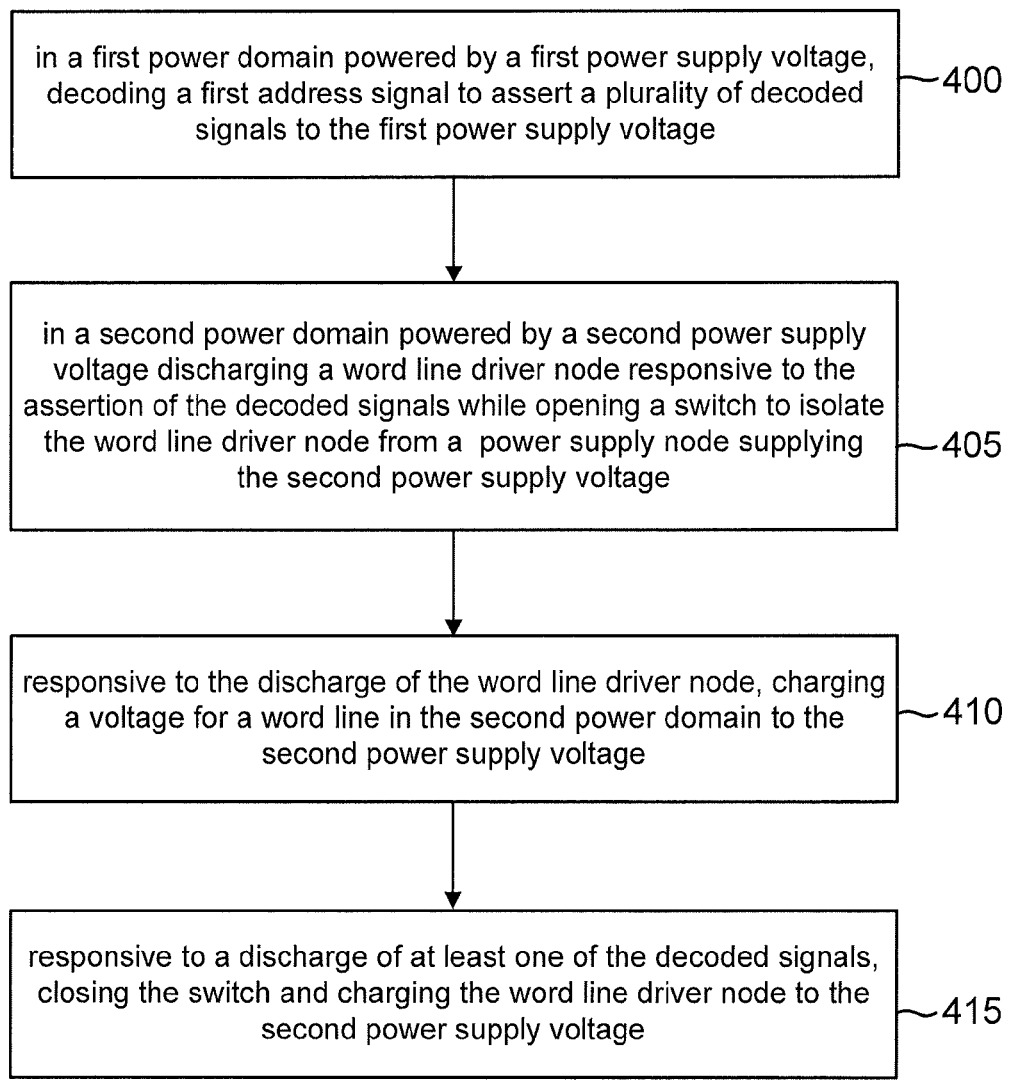
FIG. 4 is a flowchart for a method of operation for a memory including a decoder level-shifter in accordance with an aspect of the disclosure.

FIG. 4 is a flowchart for an example method of operation for a decoder level-shifter in accordance with an aspect of the disclosure. An act 400 is performed in a first power domain powered by a first power supply voltage and comprises decoding a first address signal to assert a plurality of decoded signals to the first power supply voltage. The decoding of address 203 by row decoder 202 to produced decoded signals ra, rb, and rc is an example of act 400. The method also includes an act 405 performed in a second power domain powered by a second power supply voltage that is greater than the first power supply voltage and comprises discharging a word line driver node responsive to the assertion of the decoded signals while opening a switch to isolate the word line driver node from a power supply node supplying the second power supply voltage. The discharge of NAND output node 206 while transistor P1 is switched off is an example of act 405. The method also includes an act 410 that is responsive to the discharge of the word line driver node and comprises charging a voltage for a word line in the second power domain to the second power supply voltage. The assertion of word line 225 is an example of act 410. Finally, the method includes an act 415 that is responsive to a discharge of at least one of the decoded signals and comprises closing the switch and charging the word line driver node to the power supply node. The charging of NAND output node 206 while transistor P1 is conducting is an example of act 415.

As those of some skill in this art will by now appreciate and depending on the particular application at hand, many modifications, substitutions and variations can be made in and to the materials, apparatus, configurations and methods of use of the devices of the present disclosure without departing from the spirit and scope thereof. In light of this, the scope of the present disclosure should not be limited to that of the particular embodiments illustrated and described herein, as they are merely by way of some examples thereof, but rather, should be fully commensurate with that of the claims appended hereafter and their functional equivalents.

What is claimed is:

1. A circuit, comprising:
a first logic gate configured to discharge a word line driver node responsive to an assertion of a first plurality of decoded signals to a first power supply voltage;
a word line;
an inverter powered by a second power supply voltage, wherein the inverter is configured to invert a voltage of the word line driver node into a word line voltage for the word line;
a switch coupled between a power supply input node to the first logic gate and a power supply node for the second power supply voltage; and
a second logic gate configured to switch off the switch responsive to the discharge of the word line driver node and a discharge of a complement of one of the decoded signals in the first plurality of decoded signals, wherein the second power supply voltage is greater than the first power supply voltage.

2. The circuit of claim 1, wherein the first logic gate comprises a NAND gate.

3. The circuit of claim 2, wherein the NAND gate comprises a first plurality of PMOS transistors corresponding to the first plurality of decoded signals, wherein each PMOS transistor in the first plurality of PMOS transistors includes a source coupled to the power supply input node, a drain coupled to the word line driver node, and a gate driven by the corresponding decoded signal.

4. The circuit of claim 3, wherein the NAND gate further comprises a first plurality of NMOS transistors corresponding to the first plurality of decoded signals, wherein the first plurality of NMOS transistor are arranged in series between the word line driver node and ground, and wherein each NMOS transistor in the first plurality of NMOS transistors has a gate driven by the corresponding decoded signal.

5. The circuit of claim 1, wherein the second logic gate comprises a NOR gate powered by the second power supply voltage.

6. The circuit of claim 5, wherein the switch comprises a first PMOS transistor having a source coupled to the power supply node and a drain coupled to the power supply input node, and wherein an output of the NOR gate couples to a gate of the first PMOS transistor.

7. The circuit of claim 6, wherein the NOR gate comprises a second PMOS transistor in series with a third PMOS transistor, the second PMOS transistor having a source coupled to the power supply node and a drain coupled to a source of the third PMOS transistor and a gate configured to be driven by the complement of one of the decoded signals, the third PMOS transistor having a drain coupled to the output of the NOR gate and a gate coupled to the word line driver node.

8. The circuit of claim 7, wherein the NOR gate further comprises a first NMOS transistor having a source coupled to ground and having a gate coupled to the word line driver node and having a drain coupled to the output of the NOR gate, and wherein the NOR gate further comprises a second NMOS transistor having a source coupled to ground and having a drain coupled to the output of the NOR gate and having a gate configured to be driven by the complement of one of the decoded signals.

9. The circuit of claim 1, further comprising:
a row decoder configured to decode a plurality of address signals to provide the first plurality of decoded signals.

10. The circuit of claim 9, wherein the row decoder is further configured to decode the plurality of address signals into a plurality of sets of decoded signals, and wherein the first plurality of decoded signals comprises one decoded signal from each set of decoded signals in the plurality of sets of decoded signals.

11. A method, comprising:
in a first power domain powered by a first power supply voltage, decoding an address signal to assert a plurality of decoded signals to the first power supply voltage;
in a second power domain powered by a second power supply voltage, discharging a word line driver node responsive to the assertion of the plurality of decoded signals while opening a switch to isolate the word line driver node from a power supply node supplying the second power supply voltage;
responsive to the discharge of the word line driver node, charging a voltage for a word line in the second power domain to the second power supply voltage; and
responsive to a discharge of at least one of the decoded signals in the plurality of decoded signals, closing the switch and charging the word line driver node to the second power supply voltage, wherein the second power supply voltage is greater than the first power supply voltage.

12. The method of claim 11, further comprising discharging the word line responsive to the charging of the word line driver node to the second power supply voltage.

13. The method of claim 11, further comprising NORing a complement of the one of the decoded signals with a voltage of the word line driver node in a NOR gate powered by the second power supply voltage to produce a NOR gate output signal, and wherein the closing of the switch is responsive to a discharge of the NOR gate output signal.

14. The method of claim 13, wherein the opening of the switch is responsive to a charging of the NOR gate output signal to the second power supply voltage.

15. The method of claim 11, further comprising NANDing a plurality of decoded signals in a NAND gate powered though the switch to produce a NAND gate output signal that controls a voltage of the word line driver node, wherein charging the word line driver node to the second power supply voltage comprises driving the NAND gate output signal to the second power supply voltage.

16. The method of claim 15, wherein discharging the word line driver node comprises discharging the NAND gate output signal.

17. A memory, comprising:
a row decoder configured to decode a plurality of address signals to produce a plurality of decoded signals, wherein the row decoder is in a first power domain powered by a first power supply voltage;
a NAND gate configured to NAND the plurality of decoded signals to produce a NAND gate output signal, wherein the NAND gate is in a second power domain powered by a second power supply voltage, wherein the second power supply voltage is greater than the first power supply voltage;
means for isolating the NAND gate from the second power supply voltage responsive to a reset of one of the decoded signals in the plurality of decoded signals and for coupling the NAND gate to the second power supply voltage responsive to an assertion of the one of the decoded signals;
a word line; and
a word line driver configured to assert a voltage of the word line to the second power supply voltage responsive to a discharge of the NAND gate output signal.

18. The memory of claim 17, wherein the word line driver comprises an inverter powered by the second power supply voltage.

19. The memory of claim 17, wherein the means comprises a NOR gate and a switch transistor.

* * * * *